US006909119B2

(12) United States Patent
Slater, Jr. et al.

(10) Patent No.: US 6,909,119 B2
(45) Date of Patent: Jun. 21, 2005

(54) LOW TEMPERATURE FORMATION OF BACKSIDE OHMIC CONTACTS FOR VERTICAL DEVICES

(75) Inventors: David B. Slater, Jr., Raleigh, NC (US); Alexander Suvorov, Durham, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 10/799,140

(22) Filed: Mar. 12, 2004

(65) Prior Publication Data

US 2004/0171204 A1 Sep. 2, 2004

Related U.S. Application Data

(62) Division of application No. 09/787,189, filed on Mar. 15, 2001.

(51) Int. Cl.[7] .................. H01L 31/0312; H01L 33/00

(52) U.S. Cl. ................... 257/77; 257/94; 257/99

(58) Field of Search .................... 257/77, 12, 94, 257/99, E21.054

(56) References Cited

U.S. PATENT DOCUMENTS

| 4,947,218 A | | 8/1990 | Edmond et al. | |
|---|---|---|---|---|
| 4,959,702 A | * | 9/1990 | Moyer et al. | 257/198 |
| 5,124,779 A | | 6/1992 | Furukawa et al. | |
| 5,235,195 A | | 8/1993 | Tran et al. | |
| 5,270,554 A | | 12/1993 | Palmour | |
| 5,323,022 A | | 6/1994 | Glass et al. | |
| 5,329,141 A | * | 7/1994 | Suzuki et al. | 257/103 |
| 5,409,859 A | | 4/1995 | Glass et al. | |
| 5,523,589 A | * | 6/1996 | Edmond et al. | 257/77 |
| 5,543,637 A | * | 8/1996 | Baliga | 257/77 |
| 5,969,378 A | * | 10/1999 | Singh | 257/77 |
| 6,011,279 A | | 1/2000 | Singh et al. | |
| 6,015,459 A | | 1/2000 | Jamison et al. | |
| 6,043,514 A | * | 3/2000 | Teraguchi | 257/94 |
| 6,429,041 B1 | * | 8/2002 | Ryu et al. | 438/105 |
| 6,573,128 B1 | * | 6/2003 | Singh | 438/167 |
| 2001/0010449 A1 | | 8/2001 | Chiu et al. | |

FOREIGN PATENT DOCUMENTS

| EP | 0276002 A2 | 7/1988 |
|---|---|---|
| EP | 0789388 A2 | 8/1997 |
| JP | 09082663 | 3/1997 |
| WO | WO 98/37584 A1 | 8/1998 |
| WO | WO 00/16382 A1 | 3/2000 |

OTHER PUBLICATIONS

Spieβ (aka "Spiess"), Aluminum Implantation of p–SiC for ohmic contacts, First European Conference on Silicon Carbide and Related Materials (ECSCRM 96), Oct. 6–9, 1996, pp. 1414–1419, vol. 6, No. 10, Elsevier, Switzerland.

Dev Alok et al, Low Contact Resistivity Ohmic Contacts to 6H–Silicon Carbide, Proceedings of the International Electron Devices Meeting, 1993, pp. 691–694, IEEE, New York.

Chen et al., Contact Resistivity of Re, Pt and Ta Films on n–Type Beta–SiC: Preliminary Results, Materials Science and Engineering, Jan. 1, 1995, pp. 185–189, vol. B29, No. 1/03, Elsevier Sequola, Lausanne.

(Continued)

Primary Examiner—Matthew Smith
Assistant Examiner—Lex H. Malsawma
(74) Attorney, Agent, or Firm—Summa & Allan, P.A.

(57) ABSTRACT

A semiconductor device is disclosed that includes a semiconductor substrate having a first surface and a second surface and a first conductivity type and at least one epitaxial layer on the first surface of the semiconductor substrate. The epitaxial layer is formed of a material with a dissociation temperature below that of the semiconductor substrate. A zone of increased carrier concentration is in the semiconductor substrate and extends from the second surface of the semiconductor material toward the first surface. A layer of metal is deposited on the second surface of the semiconductor substrate and forms an ohmic contact at the interface of the metal and the zone of increased carrier concentration.

13 Claims, 1 Drawing Sheet

OTHER PUBLICATIONS

Porter et al, A critical review of ohmic and rectifying contacts for silicon carbide, Materials Science and Engineering, Nov. 1, 1995, pp. 83–105, vol. B34, No. 2/03, Elsevier Sequoia, Lausanne.

A. Moki et al.; Low Resistivity As–Deposited Ohmic Contacts to 3C–SiC; Journal of Electronic Materials; 1995; pp. 315–318; vol. 24, No. 4.

T. Tadao et al.; Lowering the Annealing Temperature of Ni/SiC for Ohmic Contacts under N(2) Gas, and Application to a UV Sensor; Materials Science Forum; pp. 989–992; vols. 338–342 (2000).

* cited by examiner

LOW TEMPERATURE FORMATION OF BACKSIDE OHMIC CONTACTS FOR VERTICAL DEVICES

CROSS-REFERENCE TO RELATED APPLICATION

This application is a divisional of copending U.S. application Ser. No. 09/787,189, filed Mar. 15, 2001.

FIELD OF THE INVENTION

The present invention relates to ohmic contacts to semiconductor materials. In particular, the invention relates to methods of forming ohmic contacts to devices that include a plurality of semiconductor materials.

BACKGROUND OF THE INVENTION

In the microelectronics context, circuits are made from the sequential connection of semiconductor devices. Generally speaking, semiconductor devices are operated by, and are used to control, the flow of electric current within specific circuits to accomplish particular tasks. To connect semiconductor devices to one another, appropriate contacts must be made between the semiconductor devices. Because of their high conductivity, the most useful and convenient materials for carrying current from one device to another metals.

Such metal contacts should interfere either minimally or preferably not at all with the operation of the device or the current carrying metal. Furthermore, the metal contact must be physically and chemically compatible with the semiconductor material to which it is attached. The types of contact that exhibit these desired characteristics are known as "ohmic contacts".

An ohmic contact is usually defined as a metal-semiconductor contact that has a negligible contact resistance relative to the bulk or spreading resistance of the semiconductor, Sze, Physics of Semiconductor Devices, Second Edition, 1981, page 304. As further stated therein, an appropriate ohmic contact will not significantly change the performance of the device to which it is attached, and it can supply any required current with a voltage drop that is appropriately small compared with the drop across the active region of the device.

Ohmic contacts and methods of producing ohmic contacts are known in the art. For example, U.S. Pat. Nos. 5,409,859 and 5,323,022 to Glass et al. ("Glass patents"), discuss an ohmic contact structure formed of platinum and p-type silicon carbide and a method of making the ohmic structures. L. Spieβ et al., "Aluminium Implantation of p-SiC for Ohmic Contacts," Diamond and Related Materials, vol. 6, pp. 1414–1419 (1997); J. Chen et al., "Contact Resistivity of Re, Pt and Ta Films On n-type β-SiC: preliminary result," Materials and Science Engineering, B29, pp. 185–189 (1995); and WO 98/37584 also discuss ohmic contacts and Sic.

Although ohmic contacts and methods of making them are known, the known methods for producing ohmic contacts, and especially those produced using a silicon carbide substrate, are difficult even when properly conducted.

The problems associated with obtaining ohmic contacts are myriad and cumulative. Limited electrical conductivity of the semiconductor due to low hole or electron concentrations may hinder or even prevent the formation of an ohmic contact. Likewise, poor hole or electron mobility within the semiconductor may hinder or even prevent the formation of an ohmic contact. As discussed in the Glass patents, work function differences between the contact metal and semiconductor may give rise to a potential barrier resulting in a contact exhibiting rectifying (non-ohmic) current flow versus applied voltage. Even between two identical semiconductor materials in intimate contact with greatly differing electron-hole concentrations, a potential barrier (built-in potential) may exist, leading to a rectifying rather than ohmic contact. In the Glass patents, these problems were addressed by inserting a distinct p-type doped SiC layer between the p-type SiC substrate and the contact metal.

More difficult problems are encountered when forming ohmic contacts for newer generation gallium and indium based semiconductor devices. The formation of an ohmic contact between a semiconductor and a metal requires the correct alloying of the semiconductor and the contact metal at their interface. Selectively increasing the hole/electron concentration at the semiconductor surface where the ohmic contact metal is deposited is known as an effective means for enhancing the contact process to achieve an ohmic contact. This process is typically achieved through ion implantation, which is well recognized as a selective doping technique in silicon and silicon carbide technologies. However, in the case of silicon carbide, ion implantation is usually performed at elevated temperatures (typically>600° C.) in order to minimize damage to the silicon carbide crystal lattice. "Activating" the implanted atoms to achieve the desired high carrier concentrations often requires anneal temperatures in excess of 1600° C., often in a silicon over pressure. The equipment required for this ion implantation technique is specialized and expensive.

After the high temperature ion implant and subsequent anneal, the contact metal is deposited on the implanted substrate surface and annealed at temperatures in excess of 900° C. This method of forming contacts on semiconductor devices that incorporate gallium nitride or indium gallium nitride is not feasible because these compounds disassociate at elevated temperatures.

One theoretical answer to this problem would be to form an ohmic contact on the substrate prior to growing the delicate epitaxial layers (e.g. gallium nitride layers) necessary to complete the semiconductor device. This approach is undesirable, however, because it inserts an undesired contaminant, the contact metal, into the epitaxial growth system. The contaminant metal can effect epitaxial growth by interfering with lattice growth, doping, rate of reaction or all of these factors. In addition, metal impurities can degrade the optical and electrical properties of the epitaxial layers.

Similarly, many semiconductor devices such as metal-oxide-semiconductor field-effect transistors ("MOSFETS") require a layer of a semiconductor oxide (e.g. silicon dioxide). The high temperatures associated with traditional ion implantation techniques and implant or contact metal annealing processes place high stress on oxide layers, which can damage oxide layers, the semiconductor-oxide interface and the device itself. Alternatively, forming the ohmic contact prior to creating the oxide layer is not practical because the oxidizing environment utilized to form the oxide layers has adverse effects on the ohmic contact.

Accordingly, a need exists for a practical and economical method for forming an ohmic contact for use in conjunction with a semiconductor device that does not exhibit the manufacturing problems previously discussed. The need also exists for a type of a semiconductor device that incorporates an ohmic contact but is economic to manufacture.

OBJECT AND SUMMARY OF THE INVENTION

It is an object of the invention is to provide a semiconductor device that incorporates an ohmic contact.

It is a further object of the invention to provide a semiconductor device comprising silicon carbide and an ohmic contact.

It is a further object of the invention to provide a semiconductor device that incorporates an ohmic contact that is economic to manufacture.

It is a further object of the invention to provide a method for forming a semiconductor device that incorporates an ohmic contact.

The invention meets these objects with a method for forming a metal-semiconductor ohmic contact for a semiconductor device. The method comprises implanting a selected dopant material into a surface of a semiconductor substrate having an initial conductivity type. The implanted dopant provides the same conductivity type as the semiconductor substrate. The dopant implantation is followed by annealing the implanted semiconductor substrate a first time at a temperature and for a time sufficient to activate the implanted dopant atoms and increase the effective carrier concentrations. Depositing a metal on the implanted surface of the semiconductor material follows the first anneal. Thereafter, an annealing of the metal and the implanted semiconductor material occurs. This second anneal is at a temperature below which significant degradation of any epitaxial layers placed on the substrate would occur, but high enough to form an ohmic contact between the implanted semiconductor material and the deposited metal.

The invention also meets these objects with a semiconductor device comprising a semiconductor substrate having a first surface and a second surface and a first conductivity type. The device also comprises at least one epitaxial layer that is grown or placed upon the first surface of the semiconductor substrate. The semiconductor substrate is further defined as having a zone of increased carrier concentration in the substrate extending from the second surface (the surface opposite the epitaxial layer) toward the first surface. The device further comprises a layer of metal deposited on the second surface of the substrate to form an ohmic contact at the interface of the metal and the zone of increased carrier concentration.

The foregoing and other objects, advantages and features of the invention and the manner in which the same are accomplished, will become more readily apparent upon consideration of the following detailed description of the invention taken in conjunction with the accompanying drawings, which illustrate exemplary embodiments, and wherein:

DETAILED DESCRIPTION

The present invention is a semiconductor device incorporating an ohmic contact and a method of forming the ohmic contact.

It will be understood by those familiar with wide bandgap semiconductors, such as silicon carbide, and semiconductor devices formed therefrom that the invention is most useful in making a semiconductor device and ohmic contact utilizing n-type or p-type silicon carbide ("SiC"). Accordingly, for ease of explanation, the following description of the invention and examples will be directed toward an embodiment of the invention utilizing SiC. Those skilled in the art, however, will readily recognize that the invention may be easily adapted for use with other semiconductor materials such as silicon, gallium nitride, aluminum gallium nitride, and indium gallium nitride. As used herein, aluminum gallium nitride and indium gallium nitride include compounds where the mole percents of aluminum and gallium or indium and gallium equal 1.

In a broad aspect the invention is a semiconductor device comprising a semiconductor substrate having an initial concentration of dopant imparting an initial conductivity type. The semiconductor substrate may be either n-type or p-type. The device also comprises at least one epitaxial layer situated adjacent one surface of the semiconductor substrate.

The claimed semiconductor device is further characterized in that the semiconductor substrate is defined by a zone of increased carrier concentration extending from the surface of the substrate opposite the epitaxial layers toward the surface adjacent the epitaxial layers. A layer of metal is deposited on the substrate at the zone of increased carrier concentration to form an ohmic contact at the interface of the metal and the substrate.

Figure 1:
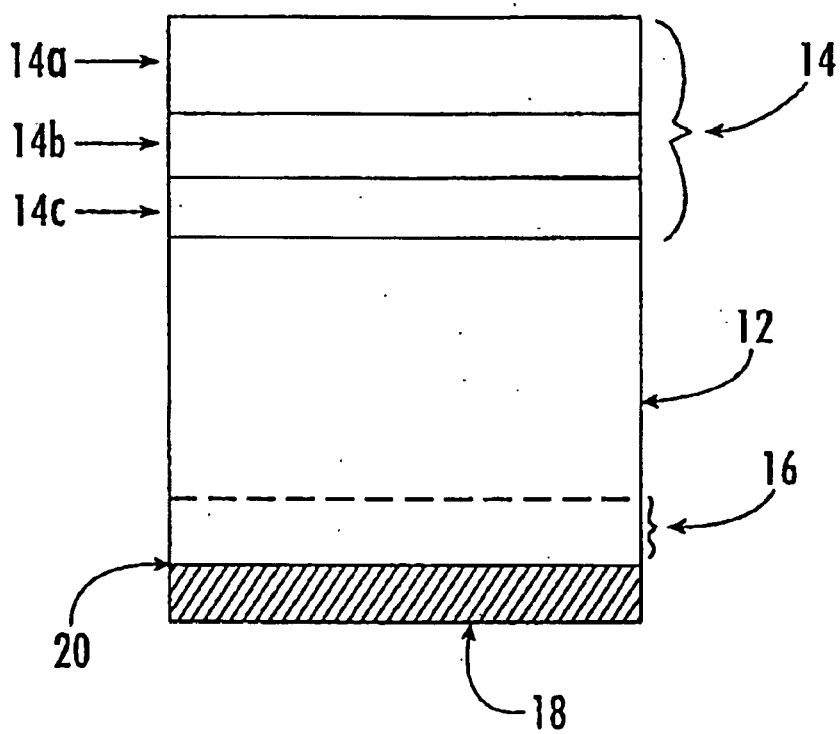
FIG. 1 is a schematic cross-sectional diagram of a semiconductor device according to the present invention.

Referring now to FIG. 1, a schematic of a semiconductor device 10 according to the invention is presented. The device 10 comprises a semiconductor substrate 12, which for purposes of explanation is considered to be SiC. It should be understood, however, that other semiconductor materials, such as silicon, may be used as a substrate in the practice of the invention. The SiC substrate 12 may be either p-type or n-type.

Situated adjacent the SiC substrate 12 are the additional components 14 necessary to complete the semiconductor device. For example and as represented in FIG. 1, the semiconductor device may be a light emitting diode ("LED") having sequential expitaxial layers 14a, 14b, and 14c of p-type and n-type semiconductor materials. In a preferred embodiment, the invention is a vertical semiconductor device such as a LED, metal-oxide-semiconductor field-effect transistor ("MOSFET"), lasers, or Schottky rectifiers that are comprised of several epitaxial layers situated adjacent a semiconductor substrate. As will be discussed later, the device according to the invention is particularly suited for vertical semiconductor devices that comprise materials having low melting or low disassociation temperatures. Such materials would include gallium nitride, indium gallium nitride and aluminum gallium nitride.

The claimed device is further characterized as having a zone of increased carrier concentration 16 on the backside of the semiconductor substrate. In other words, the semiconductor substrate, in this case SiC, has a carrier concentration near the surface of the substrate opposite the epitaxial layers that is higher than the carrier concentration exhibited in the remainder of the substrate.

The line that serves as the boundary to the zone of increased carrier concentration 16 is dotted to represent the fact that there is no sharp boundary at which the carrier concentration when the substrate 12 suddenly changes. The carrier concentration decreases as the distance from the backside surface of the substrate increases until the carrier concentration equals the initial carrier concentration. As will be discussed below, the zone of increased carrier concentration is formed by a room temperature ion implantation technique using dopants commonly associated with p-type and n-type semiconductor materials.

For example and still referring to FIG. 1, a preferred embodiment of the claimed device comprises a n-type SiC substrate doped with nitrogen. It should be understood that n-type SiC formed of other n-type dopants along with the various types of p-type SiC also may be used in accordance with the invention. The SiC substrate 12 is preferably slightly to highly doped and possess an initial carrier concentration between about $1 \times 10^{15}$ and about $1 \times 10^{19}$ cm-3. The terms "slightly" and "highly" are imprecise and are purposely used to show that the initial carrier concentration may vary considerably. Although the initial carrier concentration may vary considerably, testing has shown that substrates that are initially moderate to highly doped provide the best results. Through ion implantation of a selected dopant material (e.g. nitrogen) at the surface opposite the epitaxial layers 14, a zone 16 is created that contains a higher carrier concentration than the remainder of the substrate 12. Preferably, the ion implantation is conducted at a level that creates a zone of increased carrier concentration 16 on the backside of the substrate that exhibits a carrier concentration between about $1 \times 10^{18}$ and about $1 \times 10^{20}$ cm$^{-3}$ and that is always higher than the initial carrier concentration.

Those skilled in the art will recognize that a zone of increased carrier concentration as described previously may also be formed during the growth of the substrate. However, the difficulties associated with the variable feed rates of the required dopants and other difficulties typically associated with crystal growth methods make this approach impractical.

The preferred n-type dopants for use in forming the zone of increased carrier concentration 16 are nitrogen, arsenic and phosphorous. Preferred p-type dopants for use in forming the zone of increased carrier concentration 16 are aluminum, boron and gallium.

Although Applicant does not wish to be bound by a particular theory, evidence suggests that the zone of increased carrier concentration 16 allows for the creation of a metal contact that exhibits ohmic properties. In a preferred embodiment, a selected contact metal 18 having a melting point, vapor pressure and physical and chemical properties suitable for use with the overall semiconductor device is deposited at the surface of the SiC substrate at the zone of increased carrier concentration 16 to form an interface 20 between the metal and the substrate. Preferred metals include nickel, palladium, platinum, aluminum and titanium with nickel being most preferred. The device, including the metal and the substrate is then annealed at a temperature low enough to avoid damage to the device and specifically any epitaxial layer, but high enough to form an ohmic contact at the interface of the metal and substrate.

Again, although the Applicant does not wish to be bound by any particular theory, it appears useful to create the zone of increased carrier concentration to serve as the receptor for the contact metal. Thus, in another embodiment, the invention comprises the method of forming the ohmic contact utilized in the previously described semiconductor device.

In a broad aspect, the invention is a method for forming a metal-semiconductor contact for a semiconductor device. The method comprises implanting a selected dopant material into a semiconductor substrate having a first conductivity type and wherein the implanted dopant provides the same conductivity type as the substrate. For purposes of this discussion it will be assumed that the semiconductor substrate is a SiC substrate and that the dopant material is deposited into a surface of the SiC substrate. Those skilled in the art, however, will readily recognize that the invention may be easily adapted for use with other semiconductor materials. An annealing step follows the implanting of the selected dopant material. In this annealing step the implanted SiC substrate is annealed at a temperature and for a time sufficient to activate the implanted dopant atoms to effectively increase the carrier concentration of the implanted dopant atoms in the SiC substrate. A contact metal is then deposited on the implanted surface of the SiC substrate. The deposited contact metal and the implanted surface of the SiC substrate are then annealed. This second annealing is at a temperature below that at which any expitaxial layer placed on the substrate would experience significant degradation but high enough to form an ohmic contact between the implanted SiC and the deposited metal.

In a preferred embodiment, the semiconductor substrate may comprise a n-type or p-type substrate that may possess a slight, moderate, or high initial dopant concentration. For example, where n-type SiC is the substrate, the SiC substrate may possess an initial dopant concentration from about $1 \times 10^{15}$ (slightly doped) to $1 \times 10^{19}$ cm$^{-3}$ (highly doped). The terms "slight," "moderate," and "high" are imprecise and are used to indicate that the initial concentration of dopant in the substrate material may vary. Testing has shown that moderate to highly doped substrates achieve the best results with the invention.

The semiconductor substrate is then implanted with a selected dopant material and annealed. Preferably, the dopant implantation occurs at room temperature and the subsequent annealing occurs at a temperature between about 800° C. and about 1300° C. Dopants usually associated with the conductivity type of the substrate may be used as the dopant for the implantation step. For example, when n-type SiC initially doped with nitrogen is the substrate, nitrogen may serve as the implanted dopant. Likewise, when p-type SiC initially doped with aluminum is the substrate, aluminum may serve as the implanted dopant. Other possible n-type dopants are arsenic and phosphorous. Boron and gallium may serve as alternative p-type dopants.

Those skilled in the art will readily recognize that the implanting of the dopant material may be accomplished at high temperatures. In fact, high temperature implantation is typically preferred in the SiC context in order to reduce damage to the SiC lattice structure. In the SiC context, however, high temperature ion implantation places constraints on the commercial use of the invention. Ion implanting equipment with the capability of heating the SiC substrate during implantation are a typical, expensive and intended for research and development rather than low cost, high volume applications. Furthermore, when SiC substrates are heated to high temperatures, they must be heated and cooled at a rate that will not produce fractures thereby slowing down the production process.

Accordingly, room temperature implantation is the preferred implantation method for use in the invention. It has been discovered that room temperature implanting of dopant followed by an annealing step in a simple vented furnace capable of reaching 1300° C. and holding 100 or more substrate wafers achieves satisfactory results and greatly increases throughput.

Figure 2:
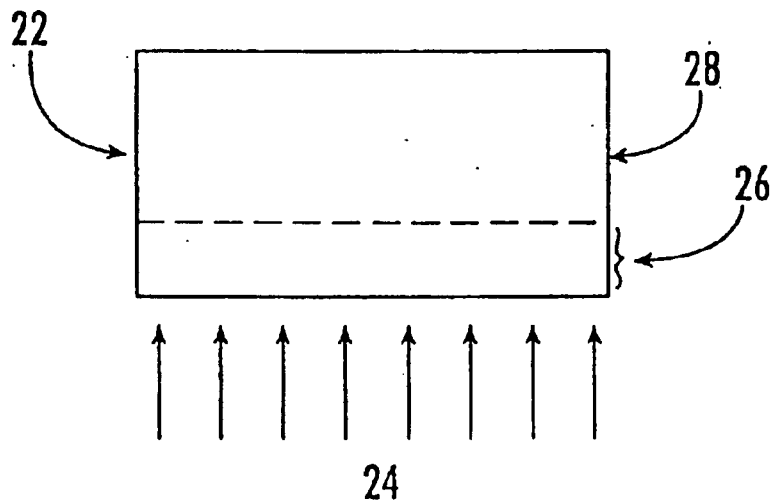
FIG. 2 is a schematic cross-sectional diagram of a dopant implantation as utilized in the method according to the invention.

The room temperature implantation of dopant is preferably conducted so as to create a zone of increased dopant concentration near the implanted surface of the semiconductor substrate. FIG. 2 is a schematic representation of the implantation process according to the invention. In this example, a n-type SiC substrate 22 having an initial dopant concentration of approximately $1 \times 10^{18}$ cm$^{-3}$ is implanted with atomic or diatomic nitrogen 24 at energies of 10 to 60 keV with doses of $1 \times 10^{13}$ cm$^{-2}$ or more. In some instances more than one implant energy may be used to create a more graduated carrier concentration distribution. The implantation process produces a zone 26 near the implanted surface of the SiC substrate approximately 1000 angstroms in depth having a total chemical dopant concentration of approximately $1 \times 10^{19}$ to $1 \times 10^{20}$ $cm^{-3}$ with the concentration of the implanted dopant decreasing as the distance from the implanted surface increases. The dopant concentration outside of the zone of increased dopant concentration 26 remains substantially the same as the initial dopant concentration. The boundary of the zone of increased carrier concentration 26 is represented as a dotted line to indicate that the change in carrier concentration between the zone 26 and the remainder of the substrate is not distinct but gradual. Those skilled in the art should recognize that the implantation energy or the dose may be readily changed to achieve desired concentrations and thicknesses.

As mentioned previously, it is necessary to anneal the implanted substrate. The annealing is required because some of the implanted dopant ions are not "active" immediately after implantation. The term "active" is used to describe the availability of the implanted ions to contribute to the overall carrier concentration of the implanted substrate.

During implantation, the crystal lattice of the SiC substrate is essentially bombarded by dopant ions. These ions crash into the crystal lattice where they are retained. This bombardment does not result in a perfect insertion of dopant ions into the existing crystal lattice. The initial positioning of many of the dopant ions may prevent the ions from being "active" participants in the crystal lattice, which itself may be damaged by the bombardment. Annealing (i.e., heating) the implanted SiC substrate provides a mechanism by which the implanted ions and the crystal lattice of the substrate may rearrange in a more orderly fashion and recover from the damage incurred during the dopant implantation.

Using round numbers solely for explanatory purposes, the implanting process may be thought of as follows. If 100 nitrogen ions are implanted in an n-type SiC substrate having an initial concentration of x nitrogen atoms, immediately after implantation the substrate may only exhibit the characteristics associated with a substrate having "x+10" nitrogen ions. However, if the substrate is then annealed and the implanted ions are allowed to settle into position in the crystal lattice, the substrate may exhibit the characteristics associated with a substrate having "x+90" nitrogen ions. Thus, the annealing step has "activated" approximately 80 of the implanted nitrogen ions.

Testing shows that annealing the room temperature implanted SiC substrate at temperatures between approximately 1000° C. and 1300° C. for about two hours or less will yield satisfactory results. The temperature and time may be easily adjusted to achieve a more complete activation of the implanted dose.

The semiconductor device comprising the above-discussed implanted substrate possesses at least one epitaxial layer. The epitaxial layer may be grown by any means known to those skilled in the art. In one preferred embodiment of the invention, the epitaxial layer is deposited prior to the dopant implantation of the substrate. However, the desired epitaxial layer or subsequently fabricated device may be made of or comprised of a material (e.g., gallium nitride or a silicon oxide) incapable of withstanding the high temperature anneal of the implanted substrate. In this instance, the epitaxial layer may be formed after the dopant implantation.

After the semiconductor substrate is implanted and a well annealed zone of increased dopant concentration is established, and any epitaxial layers placed on the substrate, the metal selected to form the ohmic contact is applied to the surface of the substrate at the zone of increased carrier concentration. The metal may be just about any metal typically used in forming electrical contacts that possesses an appropriately high melting point and vapor pressure and does not interact adversely with the substrate material. Preferred metals include nickel, palladium, platinum, titanium and aluminum with nickel being most preferred.

Preferably, the contact metal is deposited on the substrate surface to form a layer 300 angstroms thick or more. The deposition is followed by a second anneal. This anneal, however, is not a high temperature long duration anneal. This anneal preferably occurs at a temperature less than about 1000° C. and most preferably less than about 800° C. for 20 minutes or less and most preferably for 5 minutes or less. These temperatures and time periods are sufficiently low to avoid damaging any epitaxial layers that are on the substrate. The annealing of the contact metal to the semiconductor substrate results in an ohmic contact at the interface of the metal and substrate.

In a more specific embodiment of the invention, a metal semiconductor according to the invention was created using a n-type SiC substrate which was first implanted at an energy of 50 keV with a $3 \times 10^{14}$ $cm^{-2}$ dose of atomic nitrogen followed a second implantation at 25 keV at $5 \times 10^{14}$ $cm^{-2}$. The implantation was followed by an activation anneal at 1300° C. for 60 to 90 minutes in an argon ambient in a furnace. Subsequently, the contact metal, nickel was deposited on the implanted surface at a thickness of 2500 Angstroms. The contact anneal was then performed at 800° C. for 2 minutes in argon. The resulting ohmic contact exhibited satisfactory ohmic properties.

Those skilled in the art should recognize that it is also possible to conduct the contact anneal in situ with epitaxial growth.

The invention offers a substantial advantage for vertical devices such as photodetectors, light emitting diodes (LEDs), lasers, power devices such as metal-oxide-semiconductor field-effect transistors (MOSFETs), insulated gate bipolar transistors (IGBTs), pn junctions and Schottky rectifiers, and microwave devices such as SITs (static induction transistors). In the case of detectors, LEDs and lasers, epitaxially grown gallium nitride and indium gallium nitride layers are not to be subjected to anneals at temperatures that would severely damage the layers. In the case of indium gallium nitride, time at elevated temperatures becomes more critical as the indium composition of the alloy increases. Reducing the backside contact anneal temperature also reduces the potential for cracking in or disassociation of indium or gallium components in the strained heteroepitaxial films grown on SiC substrates.

In the case of power devices where homoepitaxial films of SiC are grown on the substrate and thermally grown or thermally regrown (reoxidized or annealed), oxides have an integral role in the device performance and a lower anneal temperature is an advantage. The backside metal contact can not be subjected to the oxidizing ambient that is required to grow the SiC-silicon dioxide interface, therefore, the backside ohmic contact must be deposited and annealed after the silicon dioxide is grown (reoxidized or regrown). Unfortunately, prior art anneal temperatures of about 850° C. or greater are required to subsequently form a contact to the back of the substrate (more typically 900 to 1050° C.) will create defects at the SiC-silicon dioxide interface due to mismatches in the rate of thermal expansion. This is particularly bad for MOSFETs and IGBTs.

SiC technology is in its infancy and many proposed devices and material structures are yet to be examined or developed. Further development of this process may lead to anneal temperatures that are even lower, ultimately leading to an ohmic contact between the metal and the semiconductor as deposited (i.e., no anneal).

The invention has been described in detail, with reference to certain preferred embodiments, in order to enable the reader to practice the invention without undue experimentation. However, a person having ordinary skill in the art will readily recognize that many of the components and parameters may be varied or modified to a certain extent without departing from the scope and spirit of the invention. Furthermore, titles, headings, or the like are provided to enhance the reader's comprehension of this document, and should not be read as limiting the scope of the present invention. Accordingly, only the following claims and reasonable extensions and equivalents define the intellectual property rights to the invention.

That which is claimed is:

1. A semiconductor device (10) comprising:

a semiconductor substrate (12) having a first surface and a second surface and a first conductivity type;

at least one epitaxial layer (14) on said first surface of said semiconductor substrate (12), said epitaxial layer formed of a material with a dissociation temperature below that of the semiconductor substrate;

a zone (16) of increased carrier concentration in said semiconductor substrate (12) and extending from said second surface of said semiconductor material toward said first surface; and a layer of metal (18) deposited on said second surface of said semiconductor substrate (12) that forms an ohmic contact at the interface (20) of said metal and said zone (16) of increased carrier concentration.

2. A semiconductor device according to claim 1 wherein the semiconductor substrate (12) is silicon carbide.

3. A semiconductor device according to claim 2 wherein the initial carrier concentration in the silicon carbide is between $1 \times 10^{15}$ to $1 \times 10^{19}$ $cm^{-3}$.

4. A semiconductor device according to claim 3 wherein the carrier concentration in the zone of increased carrier concentration (16) is between $1 \times 10^{18}$ and $1 \times 10^{20}$ $cm^{-3}$ and is greater than the initial carrier concentration in the silicon carbide.

5. A semiconductor device according to claim 2 wherein said metal (18) is selected from the group comprising nickel, palladium, platinum, aluminum and titanium.

6. A semiconductor device according to claim 1 wherein a material for the increased carrier concentration is selected from the group consisting of nitrogen, aluminum, arsenic, phosphorous, boron and gallium.

7. A semiconductor device according to claim 1 wherein said epitaxial layers (14) are selected from the group consisting of gallium nitride, aluminum gallium nitride; indium gallium nitride; and oxides of silicon, gallium, aluminum and indium.

8. A semiconductor device (10) comprising:

a silicon carbide substrate (12) having a first surface and a second surface and an initial concentration of dopant imparting an initial conductivity type;

at least one epitaxial layer (14) on said first surface of silicon carbide substrate (12);

a zone of increased carrier concentration (16) in said silicon carbide substrate (12) and extending from said second surface of said silicon carbide substrate (12) toward said first surface, said zone of increased carrier concentration (16) being characterized by a concentration of dopant that progressively decreases from said second surface toward said first surface; and a nickel ohmic contact (18) on said second surface of said silicon carbide substrate (12).

9. A semiconductor device according to claim 8 wherein a material for the increased carrier concentration is selected from the group consisting of nitrogen, aluminum, arsenic, phosphorous, boron and gallium.

10. A semiconductor device according to claim 8 wherein the initial carrier concentration in the silicon carbide is between $1 \times 10^{15}$ to $1 \times 10^{19}$ $cm^{-3}$.

11. A semiconductor device according to claim 10 wherein the carrier concentration in the zone of increased carrier concentration is between $1 \times 10^{18}$ and $1 \times 10^{20}$ $cm^3$ and is greater than the initial carrier concentration in the silicon carbide.

12. A semiconductor device according to claim 8 wherein said epitaxial layers (14) are selected from the group consisting of gallium nitride; aluminum gallium nitride; indium gallium nitride; and oxides of silicon, gallium, aluminum and indium.

13. A semiconductor device according to claim 8 wherein the semiconductor device is a vertical device.

* * * * *